(12) United States Patent
Sasaki et al.

(10) Patent No.: US 9,466,558 B2
(45) Date of Patent: Oct. 11, 2016

(54) SEMICONDUCTOR DEVICE AND METHOD OF MANUFACTURING THE SAME

(71) Applicant: KABUSHIKI KAISHA TOSHIBA, Tokyo (JP)

(72) Inventors: Yo Sasaki, Saitama Saitama (JP); Atsushi Yamamoto, Tachikawa Tokyo (JP); Yuuji Hisazato, Fuchu Tokyo (JP); Hitoshi Matsumura, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/448,667

(22) Filed: Jul. 31, 2014

(65) Prior Publication Data
US 2015/0249046 A1    Sep. 3, 2015

(30) Foreign Application Priority Data

Feb. 28, 2014  (JP) .................. 2014-039968

(51) Int. Cl.
| | | |
|---|---|---|
| H01L 23/48 | (2006.01) | |
| H01L 23/498 | (2006.01) | |
| H01L 23/488 | (2006.01) | |
| H01L 23/00 | (2006.01) | |
| H01L 23/373 | (2006.01) | |
| H01L 23/532 | (2006.01) | |

(52) U.S. Cl.
CPC ..... *H01L 23/49811* (2013.01); *H01L 23/3735* (2013.01); *H01L 23/488* (2013.01); *H01L 23/49822* (2013.01); *H01L 23/49866* (2013.01); *H01L 24/26* (2013.01); *H01L 23/53233* (2013.01); *H01L 2224/32225* (2013.01)

(58) Field of Classification Search
CPC  H01L 23/488; H01L 24/26; H01L 23/53233
USPC ................................... 257/762, 772
See application file for complete search history.

(56) References Cited

U.S. PATENT DOCUMENTS

| | | | |
|---|---|---|---|
| 5,038,996 A | 8/1991 | Wilcox et al. | |
| 6,727,587 B2 | 4/2004 | Riedl | |
| 6,872,464 B2 | 3/2005 | Hubner et al. | |
| 6,915,945 B2 | 7/2005 | Hubner | |
| 2010/0143707 A1* | 6/2010 | Sasaoka ............... | C23C 14/025 428/332 |
| 2010/0193801 A1* | 8/2010 | Yamada ............... | B23K 35/282 257/77 |
| 2011/0291282 A1* | 12/2011 | Yamada ................. | B22F 7/006 257/772 |
| 2012/0162958 A1* | 6/2012 | Rother .............. | H01L 23/49582 361/813 |
| 2013/0043594 A1* | 2/2013 | Sasaki ....................... | C22C 9/02 257/762 |
| 2013/0105205 A1* | 5/2013 | Takagi .................. | H01L 23/047 174/257 |
| 2013/0256390 A1 | 10/2013 | Yamaguchi et al. | |
| 2014/0248505 A1* | 9/2014 | Kalich .................... | B23K 1/19 428/553 |

FOREIGN PATENT DOCUMENTS

JP        5376356         12/2013

* cited by examiner

*Primary Examiner* — David Vu
*Assistant Examiner* — Brandon Fox
(74) *Attorney, Agent, or Firm* — Patterson & Sheridan, LLP (57) ABSTRACT

According to one embodiment, a semiconductor device includes a semiconductor element, amounting substrate which has wiring layers containing copper, and a joining layer which is provided between the semiconductor element and the wiring layer and made of an alloy containing copper and metal other than copper, and in which a melting point of the alloy is higher than a melting point of the metal.

15 Claims, 7 Drawing Sheets

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2014-039968, filed Feb. 28, 2014, the entire contents of which are incorporated herein by reference.

FIELD

Embodiments described herein relate generally to a semiconductor device and a method of manufacturing the same.

BACKGROUND

In the semiconductor device, for example, solder is used as an electrically connecting joining material between a semiconductor element and a mounting substrate. The joining material needs to be joined at a temperature lower than a breakdown temperature of the semiconductor device, and to have, after joining, a heat-resistance equal to or greater than an operating temperature of the semiconductor device. In addition, the joining material needs to have fatigue life without being broken.

DETAILED DESCRIPTION

Embodiments provide a semiconductor device, and a manufacturing method thereof in which heat resistance and fatigue life may be improved.

In general, according to one embodiment, a semiconductor device includes a semiconductor element, a mounting substrate including wiring layers thereon and/or therein containing copper, and a joining layer which is provided between the semiconductor element and the wiring layer and made of an alloy containing copper and metal other than copper, and in which a melting point of the alloy is higher than a melting point of the metal.

Hereinafter, a semiconductor device according to an embodiment will be described referring to drawings, but the exemplary embodiments are not limited thereto.

First Embodiment

Figure 1:
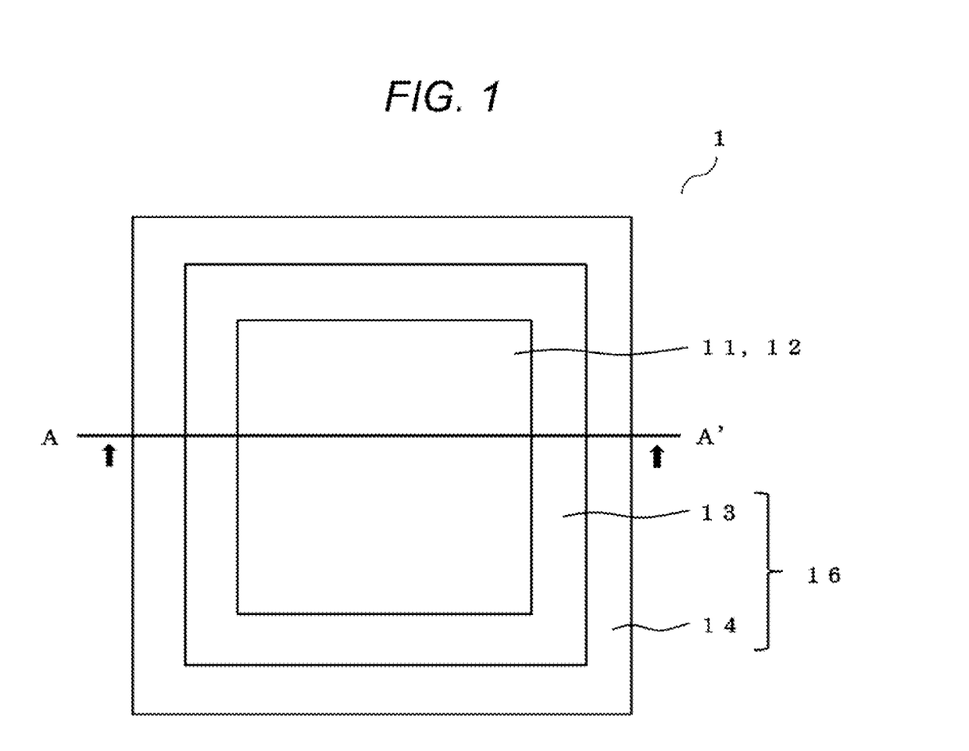
FIG. 1 is a schematic plan view of a semiconductor device according to a first embodiment.
Figure 2:
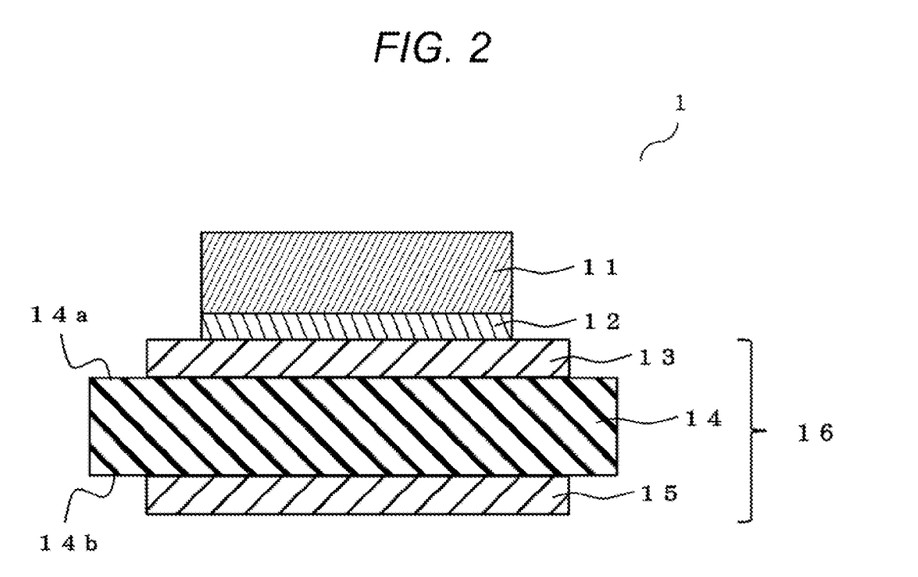
FIG. 2 is a cross-sectional view taken along the line A-A' of the semiconductor device of FIG. 1.

A structure of a semiconductor device 1 according to a first embodiment will be described referring to FIGS. 1 and 2. FIG. 1 is a schematic plan view which shows an example of the semiconductor device 1 according to the first embodiment, and FIG. 2 is a cross-sectional view taken along line A-A' of FIG. 1.

The semiconductor device 1 includes a semiconductor element 11, a joining layer 12, and a mounting substrate 16. The mounting substrate 16 includes a first wiring layer 13, an insulating substrate 14, a second wiring layer 15, a first surface 14a, and a second surface 14b which is opposite to the first surface 14a.

The first wiring layer 13 is provided on the first surface 14a of the insulating substrate 14. The second wiring layer 15 is provided on the second surface 14b of the insulating substrate 14. The joining layer 12 is provided on the first wiring layer 13. The semiconductor element 11 is provided to the mounting substrate 16 through the joining layer 12.

As the semiconductor material of the semiconductor element 11, for example, silicon (Si), silicon carbide (SiC), gallium nitride (GaN), and the like may be used. The insulating substrate 14 is formed of, for example, silicon nitride (SiN), aluminum nitride (AlN), and the like. The first wiring layer 13 and the second wiring layer 15 are made of copper (Cu). The joining layer 12 is made of a Cu—Zn alloy containing 40 wt % or more of Cu and 60 wt % or less of zinc (Zn).

The thickness of the joining layer 12 is, for example, from about 1 μm to about 100 μm. When the thickness exceeds 100 it takes longer time to form the joining layer 12, and productivity is significantly reduced. The thickness of the joining layer 12 is preferably from 5 μm to 50 μm and more preferably from 5 μm to 20 μm. When the joining layer 12 is thin, heat resistance therethrough is decreased and efficient heat dissipation is performed.

Figure 3:
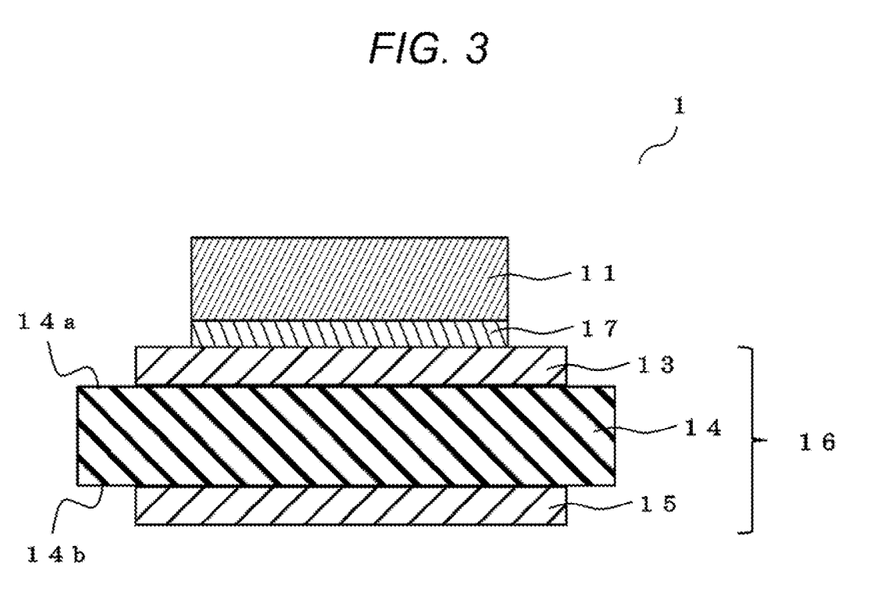
FIG. 3 is a cross-sectional view before joining taken along the line A-A' of the semiconductor device of FIG. 1.

Next, a method of manufacturing the semiconductor device 1 will be described. As shown in FIG. 3, a metal layer 17 made of Zn, which is formed by a plating method at a predetermined position on the first wiring layer 13 made of copper, which is provided on the first surface 14a of the insulating substrate 14. Then, the semiconductor element 11 is placed on the metal layer 17. The plating one method of providing the metal layer, and a thin film formation technology such as a sputtering method, a vacuum deposition method, a coating method, and the like and combinations thereof can also be used for forming the metal layer.

While applying a predetermined pressure to the mounting substrate 16 and the semiconductor element 11 in an non-reactive to metal atmosphere, temperature of the semiconductor element 11, the metal layer 17 first wiring layer 13 and the insulating substrate 14 and second wiring layer 15 are maintained between a melting point of the metal layer 17 (the melting point of Zn is 419° C.) and a breakdown or damage inducing temperature of the semiconductor element 11 and the mounting substrate 16. By maintaining the metal layer 17 in a liquid phase state for a predetermined period of time, a component (Cu) of the first wiring layer 13 and a component (Zn) of the metal layer 17 are diffused into each other. Then, the joining layer 12 made of the Cu—Zn alloy shown in FIG. 2 is formed, and the mounting substrate 16 and the semiconductor element 11 are thereby joined to each other both electrically and physically. Since pure Zn has a high vapor pressure, the pure Zn is sublimated before being melted when heated close to the melting point in a vacuum. Therefore, vacuum atmosphere is not desirable, and the joining layer is formed at or above the sublimation pressure of the metal.

An amount of inter-diffusion between the first wiring layer 13 and the metal layer 17 depends on period or time of maintenance of the temperature, retention time, atmosphere, applied pressure, and the thickness of the metal layer 17 at the time of joining. Therefore, the quantity of zinc is provided to result in a composition of the joining layer 12 is such that a Cu—Zn alloy containing 40 wt % or more of Cu and 60 wt % or less of Zn is formed. The formed joining layer 12 is a Cu—Zn alloy with a high melting point approximately equal to or more than 830° C.

Figure 4:
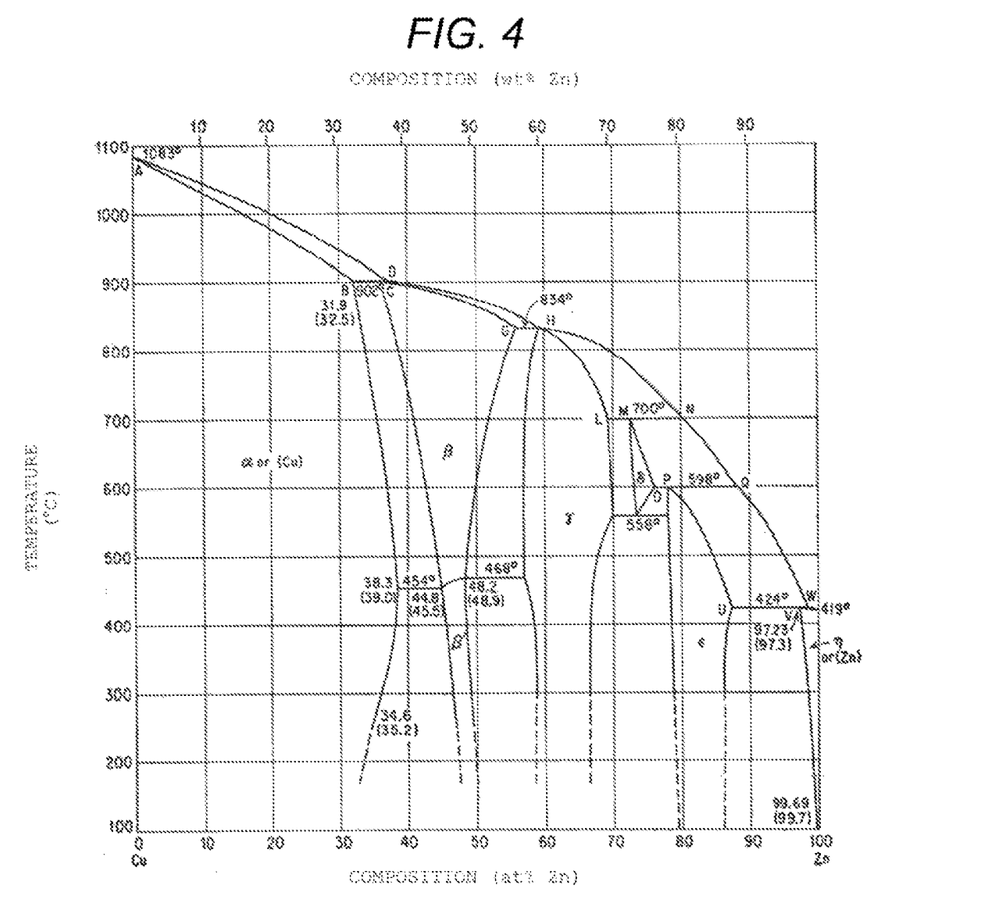
FIG. 4 is an equilibrium diagram for a Cu—Zn binary system.

Next, an effect of the semiconductor device 1 will be described. FIG. 4 is an equilibrium diagram for a Cu—Zn binary system. Compared to the melting point of the metal layer 17 (a melting point of Zn: 419° C.) before joining, a melting point of the joining layer 12 made of the Cu—Zn alloy (a melting point of the Cu—Zn alloy containing 40 wt % or more of Cu and 60 wt % or less of Zn: approximately 830° C. or more) becomes higher (As seen at line segments G-H, G-d, D-B and B or D to A of FIG. 4). Therefore, by suppressing a thermal influence of a maintaining temperature on the semiconductor device 1 at the time of joining, high heat resistance can be obtained after joining.

Figure 5:
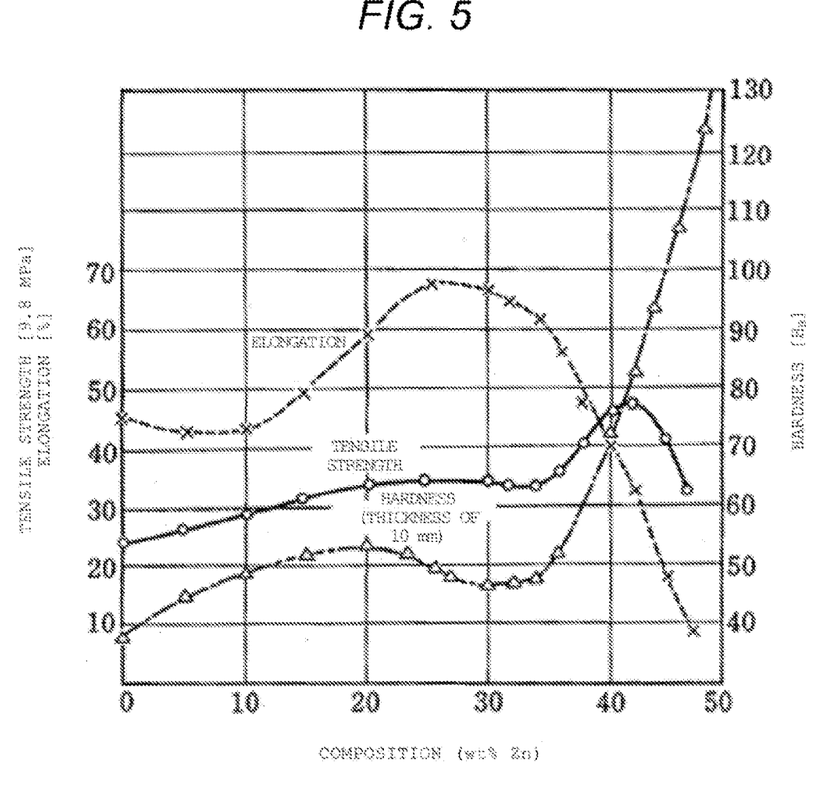
FIG. 5 is a view showing mechanical properties of a Cu—Zn binary alloy.

FIG. 5 shows mechanical properties of a Cu—Zn binary alloy (1.5 mm annealed plate). The tensile strength and the elongation of the Cu—Zn binary alloy is initially greater than that of the Cu—Sn alloy in the range or 0 to 40% Sn, and thus thermal stress during use of the semiconductor device 1 is easily absorbed by deformation of the Cu—Zn alloy formed on the joining layer, and thereby it is possible to give high heat cycle resistance to the joining layer. For example, in the Cu—Zn alloy, elongation is significantly greater between approximately 15 and 40% Zn, and tensile strength increases over from 1% to nearly 50% range of Zn, as shown in FIG. 5. However, if the amount of Zn is increased too much, elongation will decrease and the diffusion time increases, and thereby the heat cycle resistance is lowered. Therefore, a Cu—Zn alloy containing 40 wt % or more of Cu and 60 wt % or less of Zn is desirable.

Figure 6:
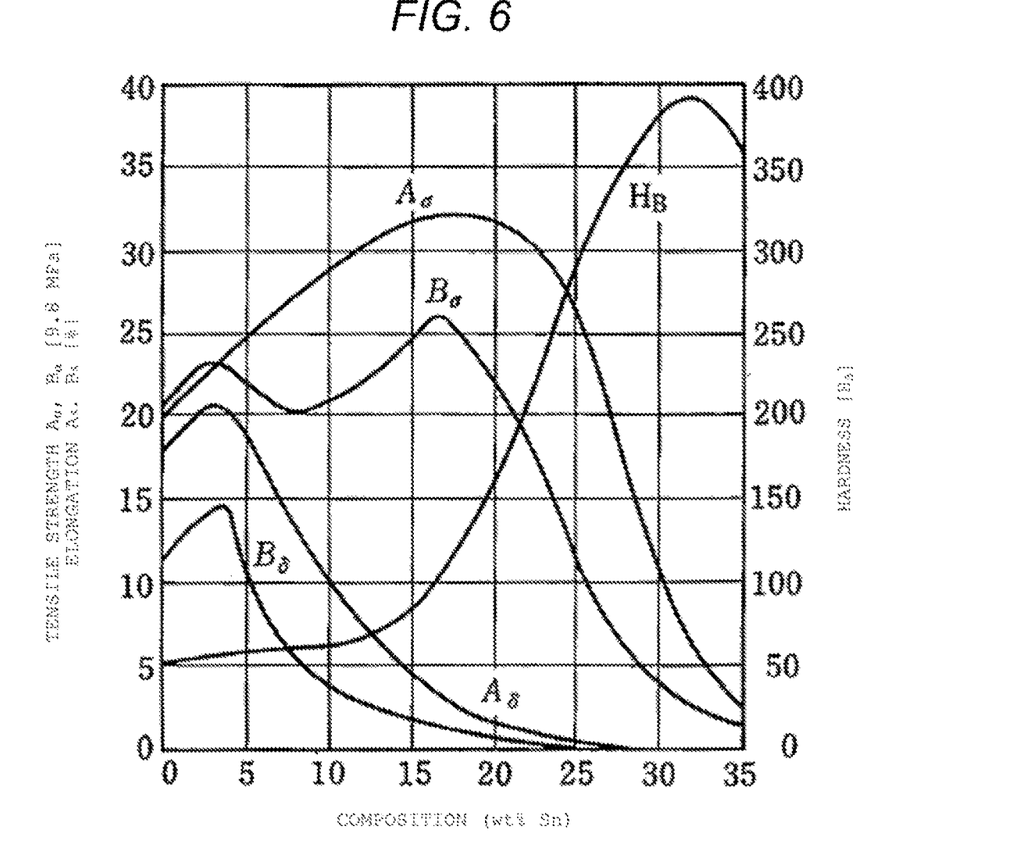
FIG. 6 is mechanical properties of a Cu—Sn binary alloy.

For a comparison, a case of using a Cu—Sn binary alloy which is an alloy of Cu and Sn will be described as a conventional example. FIG. 6 shows mechanical properties of the Cu—Sn binary alloy (A: annealed casting, B: casting). The Cu—Sn binary alloy has a rapidly decreasing elongation when increasing an amount of Sn content therein (in the drawing, Aδ and Bδ), so that the Cu—Sn binary alloy is unlikely to elongate without breakage when a stress is imposed thereon by an external force. Therefore, it is not possible to absorb thermally induced deformation stress occurring during use of the semiconductor device 1 and delamination or fracturing of the joining layer, substrate or semiconductor element 11 may occur. For example, when joining the semiconductor element 11 including SiC as a main material and the mounting substrate 16 including Cu as a main material through the joining layer 12, the semiconductor element 11 is very likely to be broken when used under a heat cycle environment with a large temperature difference. As described above, it is possible to expect a large improvement in heat resistance and fatigue life by using the Cu—Zn binary alloy for the joining layer 12.

Second Embodiment

Hereafter, a second embodiment will be described using FIG. 2. A point of the second embodiment which is the same as of the first embodiment will not be described, but different points will be described.

The second embodiment is different from the first embodiment in that a Cu—Zn—Al alloy containing, as between the Cu and Zn only, 40 wt % or more of Cu and 60 wt % or less of Zn, and with respect to the Cu+Zn wt % compared to the Al wt %, 20 wt % or less of aluminum (Al) is used in the joining layer 12.

Next, a method of manufacturing the semiconductor device 1 will be described. The metal layer 17 is made of a Zn—Al alloy and is maintained at a temperature equal to or more than a melting point of the metal layer 17 (a melting point of Zn—Al: 382° C.). By maintaining the metal layer 17 in a liquid phase state for a predetermined period of time, a component (Cu) of the first wiring layer 13 and a component (Zn—Al) of the metal layer 17 are diffused to each other, and the joining layer 12 made of a Cu—Zn—Al alloy is formed, and thereby the mounting substrate 16 and the semiconductor element 11 are joined together.

Figure 7:
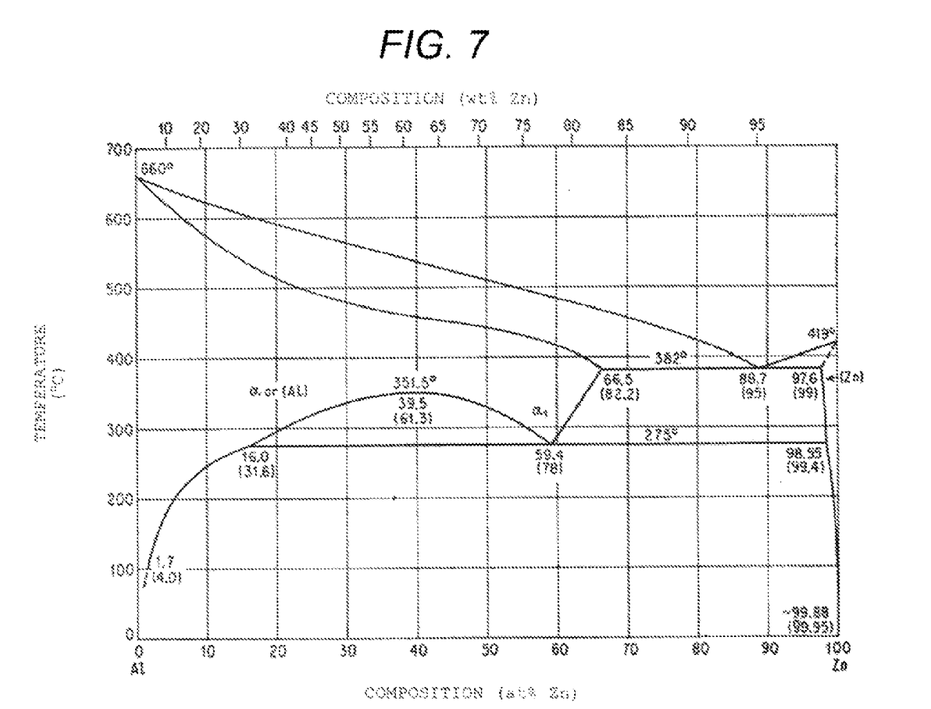
FIG. 7 is an equilibrium diagram for an Al—Zn binary system.

Next, the effect of the semiconductor device 1 will be described. FIG. 7 is an equilibrium diagram for an Al—Zn binary system. Compared to a melting point of Zn (419° C.), the melting point can be lowered to 382° C. by adding Al to Zn. Therefore, the temperature at the time of joining to form the Cu—Zn—Al alloy can be further reduced by using Zn—Al instead of Zn as the metal layer 17, and adverse thermal effects on the semiconductor device 1 can be suppressed. However, when increasing an amount of Al content too much, the melting point is increased. Therefore, a Cu—Zn—Al alloy of 40 wt % or more of Cu, 60 wt % or less of Zn, and 20 wt % or less of Al with respect to the Zn is desirable.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor element;
   a mounting substrate which includes wiring layers containing copper; and
   a joining layer provided between the semiconductor element and one of the wiring layers, the joining layer made of an alloy containing copper and zinc in an amount of 15 wt % to 60 wt %, wherein:
   a melting point of the alloy is higher than a melting point of the zinc; and
   the joining layer contains aluminum, and the alloy contains 40 wt % or more of copper and 20 wt % or less of Al with respect to the amount of zinc.

2. The device according to claim 1, wherein the thickness of the joining layer is from 1 μm to 100 μm.

3. The device according to claim 1, wherein the joining layer is formed in situ between a preexisting copper layer and a metal layer.

4. The device according to claim 3, wherein the joining layer is an alloy of the metal layer and the copper layer.

5. The device according to claim 3, wherein the metal layer is an electroplated layer.

6. The device according to claim 3, wherein the joining layer has a higher melting temperature than the metal layer.

7. The device according to claim 6, wherein the melting temperature is greater than 830 degrees C.

8. The device of claim 1, wherein the amount of zinc is 15 wt % to 40 wt %.

9. A method of manufacturing a semiconductor device, comprising:

providing a metal layer including zinc on a wiring layer containing copper;

mounting a semiconductor element on the metal layer; and forming, between the semiconductor element and the wiring layer, a joining layer made of an alloy having a melting point higher than a melting point of the metal layer, and which contains copper and the zinc in an amount of 15 wt % to 60 wt %, by heating the metal layer to a temperature higher than the melting point of the metal layer, wherein the metal layer contains aluminum, and the alloy contains 40 wt % or more of copper and 20 wt % or less of aluminum with respect to the amount of zinc.

10. The method according to claim 9, wherein the thickness of the joining layer is formed to be from 1 μm to 100 μm.

11. The method according to claim 9, wherein the joining layer is formed in an environment which is non-reactive with the metal layer.

12. The method according to claim 9, wherein the joining layer is formed at or above the sublimation pressure of the metal layer.

13. A semiconductor device, comprising a semiconductor element chip, a substrate having copper wiring thereon, and a joining layer formed in situ on the device from the alloying of zinc with the copper wiring on the substrate, wherein the joining layer includes at least 15 wt % zinc, wherein the joining layer further includes aluminum therein, and the quantity of aluminum is less than 20 wt % with respect to the quantity of zinc in the joining layer.

14. The semiconductor device of claim 13, wherein the joining layer includes 15 wt % to 40 wt % zinc and 85 wt % to 60 wt % copper.

15. The semiconductor device of claim 13, wherein the melting temperature of the joining layer is greater than 830 degrees C.

* * * * *